United States Patent
Cowans et al.

(10) Patent No.: US 8,453,468 B1
(45) Date of Patent: Jun. 4, 2013

(54) SYSTEM AND METHOD FOR THERMAL CONTROL OF DIFFERENT HEAT LOADS FROM A SINGLE SOURCE OF SATURATED FLUIDS

(75) Inventors: Kenneth W. Cowans, Fullerton, CA (US); William W. Cowans, Fullerton, CA (US); Glenn Zubillaga, Canyon Lake, CA (US)

(73) Assignee: BE Aerospace, Inc., Wellington, FL (US)

( * ) Notice: Subject to any disclaimer, the term of this patent is extended or adjusted under 35 U.S.C. 154(b) by 469 days.

(21) Appl. No.: 12/726,379

(22) Filed: Mar. 18, 2010

Related U.S. Application Data

(60) Provisional application No. 61/161,091, filed on Mar. 18, 2009.

(51) Int. Cl.
F25D 13/04 (2006.01)

(52) U.S. Cl.
USPC .................................. 62/65; 62/129; 62/513

(58) Field of Classification Search
USPC ............. 62/65, 117, 121, 122, 126, 129, 198, 62/498, 513
See application file for complete search history.

(56) References Cited

U.S. PATENT DOCUMENTS

| | | | | |
|---|---|---|---|---|
| 7,152,426 B1* | 12/2006 | Cowans | ........................... | 62/470 |
| 7,178,353 B2* | 2/2007 | Cowans et al. | .............. | 62/196.4 |
| 2005/0115254 A1* | 6/2005 | Knight et al. | ................ | 62/176.1 |
| 2005/0183432 A1* | 8/2005 | Cowans et al. | ................ | 62/190 |
| 2006/0041335 A9* | 2/2006 | Rossi et al. | .................... | 700/276 |
| 2006/0168976 A1* | 8/2006 | Flynn et al. | .................. | 62/196.4 |
| 2007/0095097 A1* | 5/2007 | Cowans et al. | ................. | 62/512 |
| 2007/0169491 A1* | 7/2007 | Cowans et al. | ................. | 62/190 |
| 2007/0175227 A1* | 8/2007 | Knight | ........................ | 62/176.1 |
| 2007/0277538 A1* | 12/2007 | Buck | .............................. | 62/150 |
| 2008/0077260 A1* | 3/2008 | Porter et al. | .................... | 700/90 |
| 2008/0115512 A1* | 5/2008 | Rizzo | .............................. | 62/134 |

\* cited by examiner

*Primary Examiner* — Mohammad Ali
(74) *Attorney, Agent, or Firm* — Fulwider Patton LLP

(57) ABSTRACT

A system and method for controlling cooling of a thermal load having different cooling requirements in different sections based on direct thermal exchange using a two-phase refrigerant employs the pressure/temperature characteristics of the refrigerant to particular benefit for this multi-level cooling system. The two-phase refrigerant is first adjusted to have temperature/enthalpy characteristics chosen as the starting level for different cooling demands at related temperatures. After appropriate generation of a mixture of two-phase refrigerant initial reference temperature and pressure are established. Thereafter, incremental changes in the comprising hot gas and expanded cooled liquid/vapor, an temperature cooling medium area made by lowering the pressure by predetermined amounts, or alternatively by bypassing the pressure drop and proceeding to the next stage.

13 Claims, 4 Drawing Sheets

SYSTEM AND METHOD FOR THERMAL CONTROL OF DIFFERENT HEAT LOADS FROM A SINGLE SOURCE OF SATURATED FLUIDS

REFERENCE TO PRIOR ART

This application relies for priority on provisional application Ser. No. 61/161,091 filed Mar. 18, 2009 by K. W. Cowans et al and entitled "System and Method for Thermal Control from a Single Source of Different Heat Loads".

BACKGROUND OF THE INVENTION

U.S. Pat. No. 7,178,353 and U.S. Pat. No. 7,415,835 disclose a novel temperature control concept which has been termed Transfer Direct of Saturated Fluids (TDSF) and which concept has material advantages for many temperature control systems used in modem high technology processes. In accordance with this concept, a two-phase fluid that is being used for temperature control is first compressed to a high pressure, high temperature gas, which is variably divided into two flows, the mass flow of one of which is directly controlled. The remaining second flow is condensed to a liquid state by cooling and then cooled further by being expanded to a vapor or liquid/vapor state as a saturated mist. The flow of hot compressed gas is varied under command signals derived from sensing the load temperature to a level such that the pressurized component, when mixed with the differential flow of saturated liquid/vapor mist provides a combined output of selectively controlled enthalpy, pressure and temperature. The load temperature is thus adjusted to the desired target level by direct control of the proportion of gas flow alone, accompanied by concurrent indirect control of the second or liquid/vapor state. After thermal exchange of the combined flow with the thermal load, the two-phase fluid is returned, using appropriate conditioning, for recompression in a closed loop operation.

Systems and method employing two-phase refrigerant in direct contact with a thermal load in this manner can provide precise but changeable control of load temperature over a wide dynamic range. The concept of uniting a variably pressurized two-phase refrigerant with a differential flow of saturated mist component to provide precise and stable temperature control of a thermal load has many advantages. The thermodynamic cycle is efficient, and also avoids the costs and thermal losses involved in using a separate thermal exchange medium. Additionally, because the process relies on pressure as well as enthalpy, rapid changes in a precisely defined target temperature can sometimes be introduced by pressure change alone. Where the temperature to be controlled and the heat load permit, temperature stabilization can be aided by use of the latent heat of evaporation or condensation in a two-phase mixture at thermal equilibrium.

The TDSF concept, therefore, not only has many current applications but also potential for more and different embodiments. Some operative non-uniformities which can be encountered, for example in some semiconductor manufacturing operations, have given rise to novel problems. When processing a semiconductor wafer, for example, the wafer may be mounted with its base side in contact with a thermally controlled (cooled) support platen. Then the upper side of the wafer, typically after having received a patterned protective layer, is exposed to a very high intensity energy source, such as a plasma, and a desired pattern is etched by bombardment into the wafer surface.

The TDSF system has proven to be superior for these, as well as other applications in general. Because of the historical trend in the semiconductor industry toward use of wafers of ever larger size, (wafers may now be greater than 300 mm diameter) the problems involved in laying down essentially microscopic high density patterns uniformly across the wafer area have been exacerbated. Moreover, significant differences in thermal exchange characteristics can exist between different areas of such large wafer surfaces. For example, the intensity of the heating source may vary materially across different areas of the wafer and thermal exchange efficiency may also vary somewhat with location on the wafer. Such variations can unacceptably reduce output yield in terms of the percentage of high quality micro images that can be formed within the patterns introduced into the wafer surface.

Even though a thermal control system based upon the TDSF concept provides a stable and precise temperature source at a target level, areal dispersion of the flowing plasma or other medium across the wafer may thus not be uniform. Variations in heat loads and heat transfer across different areas may therefore have to be compensated for, if possible, to improve quality and yield. The present invention introduces expedients which equalize thermal exchange between the temperature control medium and different areas of a relatively large heat load such as a modern semiconductor wafer. Such improvements are particularly suitable for TDSF system but can be applicable to other thermal control systems as well.

It is known to vary the temperature of refrigerant gas within a thermal transfer fluid loop, as described in Cowans U.S. Pat. No. 6,775,996, issued Aug. 17, 2004. That system, however, is not a TDSF system, and the expedients described are not applicable to the problem of providing differential thermal energy exchange between different parts of a thermal load, particularly a semiconductor wafer.

SUMMARY OF THE INVENTION

In accordance with the invention, the interrelated dual flow control and mixing approach that characterizes TDSF systems is employed to generate a mixed input coolant stream which differentially controls separate regions of an areally varying thermal load. This approach may specifically be used, for example, where different thermal transfer requirements exist during concurrent processing of different areas of a semiconductor wafer. This may occur when the heat source varies with location on the wafer, or conversely where coolant distribution varies for some reason.

After appropriate flow control and mixing of the differentially related flows of variable temperatures and pressure in a TDSF system the combined flow of controlled pressure and enthalpy at selected levels is further diverted into two or more separate sub-flows of different thermal properties. This is feasible because the two-phase characteristic of the coolant media enables the coolant properties to be varied by pressure as well as flow rate for different zones of the load. Thus, by introducing pressure drops or flow rate differences in separate flow branches from a mixed flow of hot gas and cooled expanded fluid different thermal transfer requirements can be met by a TDSF-based system.

In a first example, where there is a known differential in cooling flow requirements between wafer areas, the flow paths of coolant form a common source directed toward two different areas of a wafer are serially connected by a pressure dropping device. The temperature of the saturated fluid in the flow path between adjacent zones is thus controllably lowered between the first and second zones. The temperature of the coolant in the first zone can thus be preselected to compensate for a first known thermal transfer requirement, where the cooling need is lower because the radiation intensity is relatively lower. In the second zone area, which receives exposure to higher intensity radiation, the temperature of the coolant is lowered by introducing a pressure drop, and thus the wafer is cooled in this zone to the same temperature as in the first zone. Thus the processing conditions are equalized, improving process uniformity throughout two or more zones. In addition, the pressure dropped device can be bypassed, affording greater operative flexibility in the system.

In an alternative version of a multi-zone temperature control system using the TDSF control approach, the temperature of flows into the separate zonal areas can be unidirectionally adjusted downward from an initial level in multiple steps in accordance with needed thermal exchange conditions. In a specific example, control in each separate zone is effected by flowing coolant serially through successive heat exchange regions via paired combinations of pressure dropping and bypass valves. Each pressure-dropping valve is opened or bypassed to establish the desired process temperature for that region of the wafer. This approach enables a wider range of variables to be encompassed in the temperature compensating control system and retains local control to the degree feasible.

BRIEF DESCRIPTION OF THE DRAWINGS

A better understanding of the invention may be had by reference to the following description, taken in conjunction with the accompanying drawings, in which like numbers refer to like parts, and in which.

DETAILED DESCRIPTION OF THE INVENTION

Figure 1:
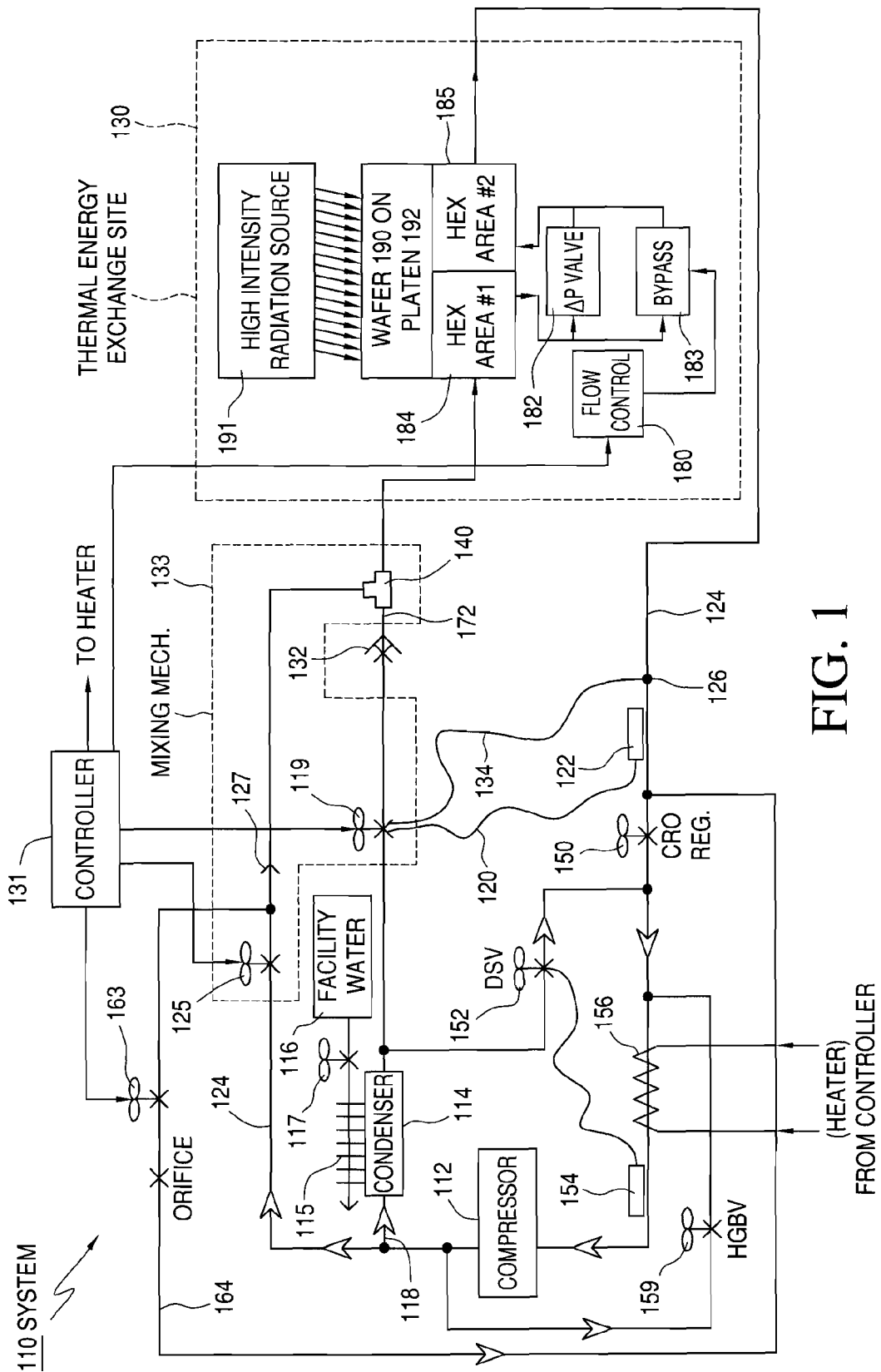
FIG. 1 is a block diagram representation of a temperature control system for differentially controlling zonal temperatures using a single temperature controlled two-phase refrigerant mixture as a source.

Referring now to FIG. 1, a TDSF system for temperature control of more than one zone is depicted in block diagram form and includes the principal features of a TDSF system as described in the above-referenced patents. Briefly, such a system 110 includes two principal flow paths from the output of a compressor 112, these flow paths branching from a main output line 124 from the compressor 112. One branch line 118 from the compressor output line 124 is directed through a condenser 114 that provides a cooled liquefied output to a thermo-expansion valve 119, which expands and cools the flow to a liquid/vapor mix which is dependent in temperature on the pressure of said liquid/vapor mix after expansion. The flow rate of said mix is indirectly controlled, since it varies in intensity with respect to the mass flow in the main output line 124 as determined by a controller 131 which operates a proportional valve 125 in the output line 124. The separate flow, which is cooled and expanded, as described hereafter, provides one input to a mixing mechanism 133, specifically at a mixing tee 140. The mixing tee 140 also receives the pressurized hot gas from the compressor 112, after it has been directly varied at the externally controlled proportional valve 125 (followed by a check valve 123) governed by the controller 131 so that it is delivered at a variable mass flow rate to the mixing tee 140. While the thermo-expansion valve 119 is shown as settable by the controller 131, this expedient is not needed for control, but provides an added capability. The direct control of hot gas flow provides indirect control of the remainder flow, as described in the referenced patents.

Condensate output from the condenser 114, which has a flow rate constituting the differential in flow remaining after the proportional valve 125 diversion, is thus variably expanded through the thermo-expansion valve 119 to provide the maximum refrigeration available, dependent on the pressure at the input to the compressor 112. This expanded flow is lowered in pressure by a Δp valve 132 before reaching the input of the mixing tee 140 to which it is coupled. The controller 131 thus directly sets the proportional valve 125 to provide, ultimately, a precisely determined temperature and pressure from the mixing mechanism 133. This controlled output from the mixing mechanism 133 is fed as an input to the thermal energy exchange site 130, for controlled cooling of the thermal load 184 that is being processed, such as a semiconductor wafer 190 undergoing a fabrication step (such as etching by radiation from a high intensity source 191), on a platen 192.

As described in more detail in the previously filed patents and applications, and therefore only briefly here, the return line 124 from the heat exchange site 130 is coupled through intermediate devices back to the input to the compressor 112 to complete the refrigeration control loop. For example, along the return line 124 a coupling 126 provides an equalizing pressure via a line 134 to the thermo-expansion valve (TXV) 119, which is controlled by a pressure signal provided via a coupling 120 from a sensor bulb 122 in close thermal contact to the return line 124.

The system 110 has other features which need only be referred to briefly herein, including a feedback line 164 intercepting the output of the proportional valve 126 and including a flow control orifice. The line 164 also includes a control valve 163 which couples the compressor 112 output back to the compressor 112 input from a point following the proportional valve 125. This valve 163, when opened by the controller 131, provides flow from line 164 to the compressor 112 input. This is useful to increase control at the lower temperatures. Also, the compressor 112 output can be fed back conventionally, through a hot gas bypass valve 165, to the compressor 112 input. This action adjusts the lower limit of pressure input to compressor 112. In addition the compressor 112 input also may be guaranteed to be substantially entirely gaseous by the controller 131, through an electrical heater 156 before its input. Said heater 156 boils off any liquid in the mix supplied to the compressor 112 input. A desuperheater valve (DSV) 152 in a line from the output of the condenser 114 is coupled to the input to the compressor 112, before the heater 156. A sensor bulb 154 proximate the compressor 112 input controls the desuperheater valve (DSV) 152 in conventional fashion. Further, a close-on-rise (COR) regulator 150 is included in the input line to the compressor 112 prior to the junction with the DSV 152 line, as described in the TDSF patents referred to above.

In this exemplification of the TDSF system, the two different heat exchange regions 184, 185 exist in the heat exchange site (load) 130. These heat exchange regions, which may in practice be adjacent, concentric or in some other geometry, serially receive coolant input with intermediate flow control 180 operated by the controller 131. If the requirements for cooling differentially are invariant then flow controls responsive to the controller 131 are not required. A first heat exchange section, designated 184 and "HEX area 1" is physically adjacent a first predetermined area of the wafer 190 via the platen 192. A second heat exchange section, designated 185 and "HEX area 2" is spatially distinct from the first area 184 but physically adjacent a different area of the wafer 190, and in heat exchange relationship thereto via the adjacent part of the platen 192 on which it resides.

Figure 2:
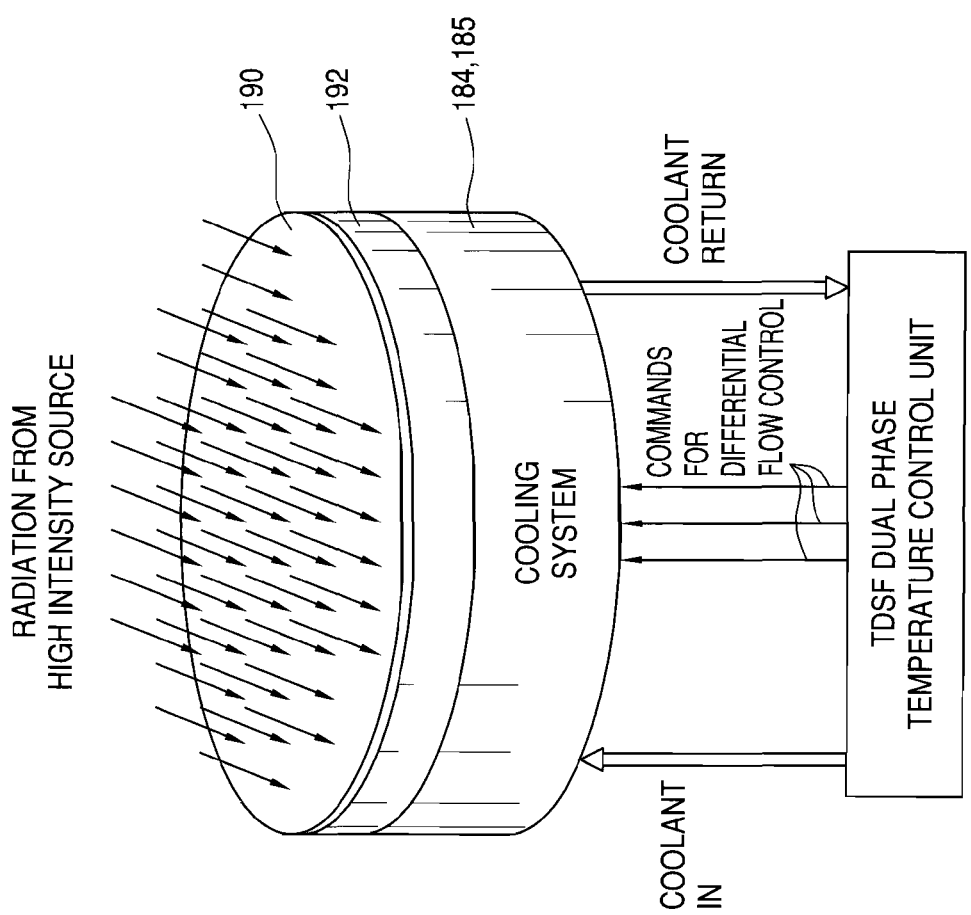
FIG. 2 is a simplified perspective representation of a portion of a semiconductor processing facility, providing one example of how zonally different thermal requirements arise in processing a wafer.
Figure 3:
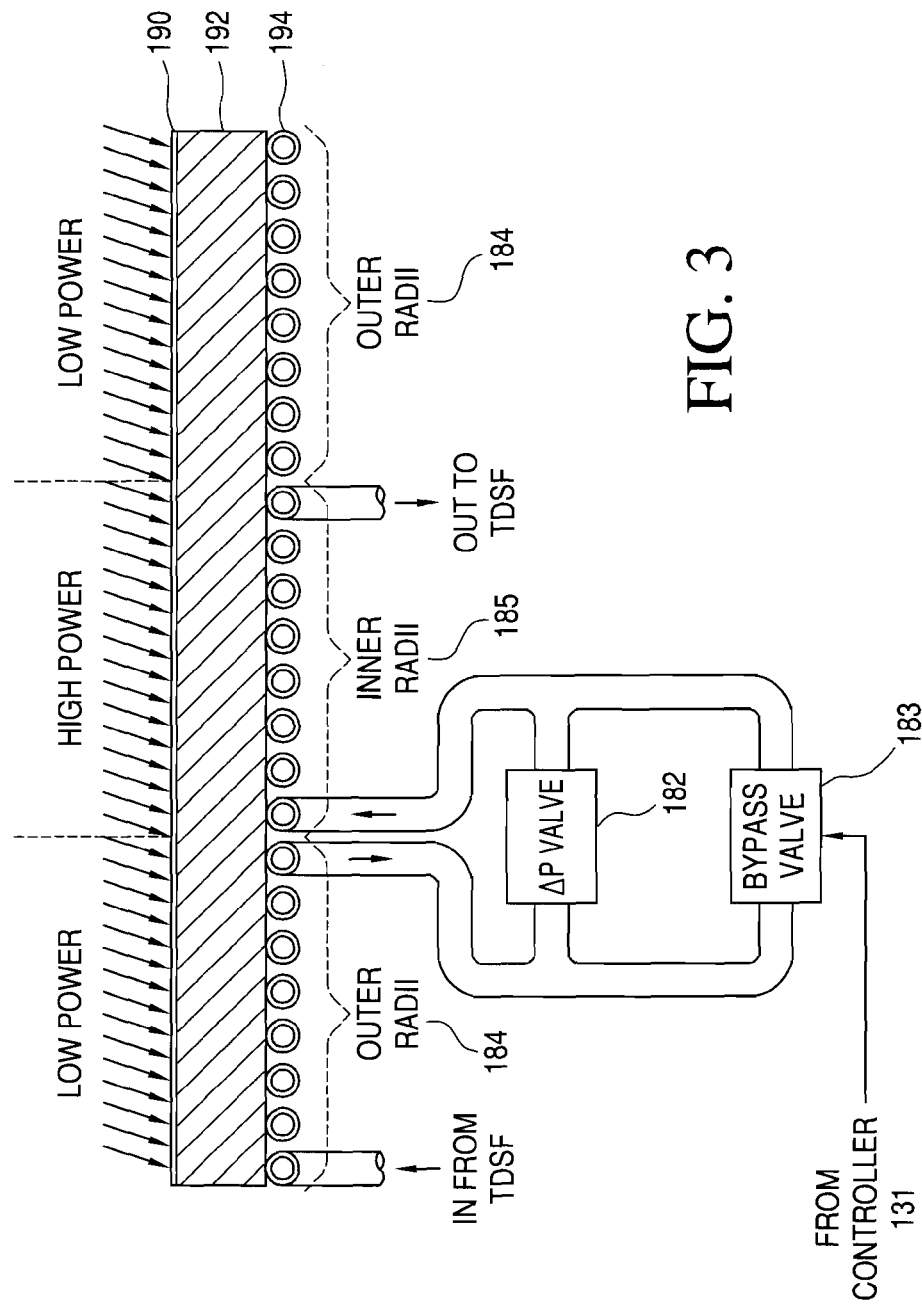
FIG. 3 is an idealized and simplified side-sectional fragmentary view of the relation between a wafer on a platen, which is associated with an underlying cooling system and in which the wafer is impacted by a plasma excitation medium.

In one exemplification, as seen more particularly in FIGS. 2 and 3, the wafer 190 is functionally divided into an inner radial zone (HEX area #1) and an outer radial zone (HEX area #2), both receiving impinging radiation from the plasma or other source (symbolically depicted in FIGS. 2 and 3) so that a pattern is etched in accordance with a conventional protective overlaying pattern (not shown). The difference in heat exchange requirements arises from differential bombardment of areas of the wafer in process. As seen particularly in FIG. 3, the first cooled heated area 184 is subjected to lower power density bombardment than is the second heated area 185, because here the second area 185 of the wafer 190 is closer to the geometric center of the wafer 190. The wafer 190 is exposed to impinging plasma on its upper side, while its lower side is in contact and thermal exchange relation with the platen 192 (FIGS. 2 and 3). The platen 192 and the wafer 190 are cooled by conductive heat exchange between the coolant flowing in encircling passageways defined by continuous tubing 194 (FIG. 3) distributed at different radii throughout the area of the platen 192. The wafer 190 is in close thermal contact with the upper surface of the platen 192 and thus with the coolant in the thermally connected tubing 194, which is in essentially continuous contact, along its length, with underside of the platen 192. Thus the refrigerant cools the differentially heated wafer 190 at the heat exchange site 130 (FIG. 1) and in accordance with the invention this cooling is effected in an appropriate differential manner by using the particular properties of the two-phase refrigerant.

The coolant flow path here incorporates a separate flow control 180 (FIG. 1) for limited adjustment of the temperature of thermal transfer coolant in thermal contact with the first and second heat exchange areas 184, 185. The flow temperatures within these areas 184, 185 can be altered when needed, as is usually the case, by the pressure dropping ($\Delta p$) valve 182 in the serial flow path between the two areas 184, 185, as seen in both FIGS. 1 and 3. This valve 182 introduces a pressure drop, therefore a temperature drop in the flow along segments of the heat exchanger tubing 194. Thus the two radially adjacent areas 184 and 185 of the wafer 190 are cooled differentially, each as needed in accordance with the level of impinging plasma energy, to be held at a like selected level despite a difference in the thermal energy of impinging excitation.

The controller 131 may alternatively open the bypass valve 183, effectively shunting all flow around the $\Delta p$ valve 182, to provide like temperatures in the first and second HEX areas 184, 185 under appropriate circumstances.

Consequently, significant temperature variations between different wafer areas that arise from non-uniformity in the incident radiant power can be compensated for by manipulation of pressure and temperature of a two-phase refrigerant in a manner to equalize wafer surface temperature, thus improving fabrication reliability and yield. Because the coolant in the TDSF system is a two-phase fluid of saturated mist, the expedient of introducing a fixed temperature drop is an advantageous way to introduce the desired temperature differential in coolant flow.

In the example of FIGS. 1-3, the coolant flows circumferentially about the tubing 194 at different radii as the coolant passes within it relative to the surface of the wafer 190 and the supporting platen 192, as best depicted in FIG. 3. For simplicity and by way of example only it is assumed that, as seen in FIG. 2, the intensity distribution of plasma from the source 191 (FIG. 1) has higher intensity radiation on one side ("area 2") and lower intensity radiation on the other side ("area 1") of radially adjacent zones, as viewed in FIG. 2.

However, if the energy distribution of the impinging media is geometrically different, i.e. rectilinear, the pattern of tubing 194 in areas #1 and #2 of the wafer 190 and platen 192 can be shaped as rectilinear grids in adjacent zones, and interconnected by rectilinearly disposed tubing. At the region of juncture of these two zones, the coolant temperature can be dropped by the $\Delta p$ valve 182 so the region exposed to lower power excitation will be cooled to a lesser degree.

In the example of FIG. 1, the bypass valve 183 provides an alternative path if no coolant differential needs to be used. Such a feature may be particularly expeditious during rapid cooling of the entire platen from one processing temperature to a lower one. Both the $\Delta p$ valve 182 and the shunt bypass 183 can be operated by the controller 131.

Accordingly, the thermal properties and two-phase character of the coolant in the TDSF system are used to introduce a precise temperature differential between the cooling power levels applied to the two adjacent but differently heated regions of the wafer 190. Clearly, other appropriate flow path geometries and suitably placed pressure drops can be employed where the power distribution of incident radiation is different.

Figure 4:
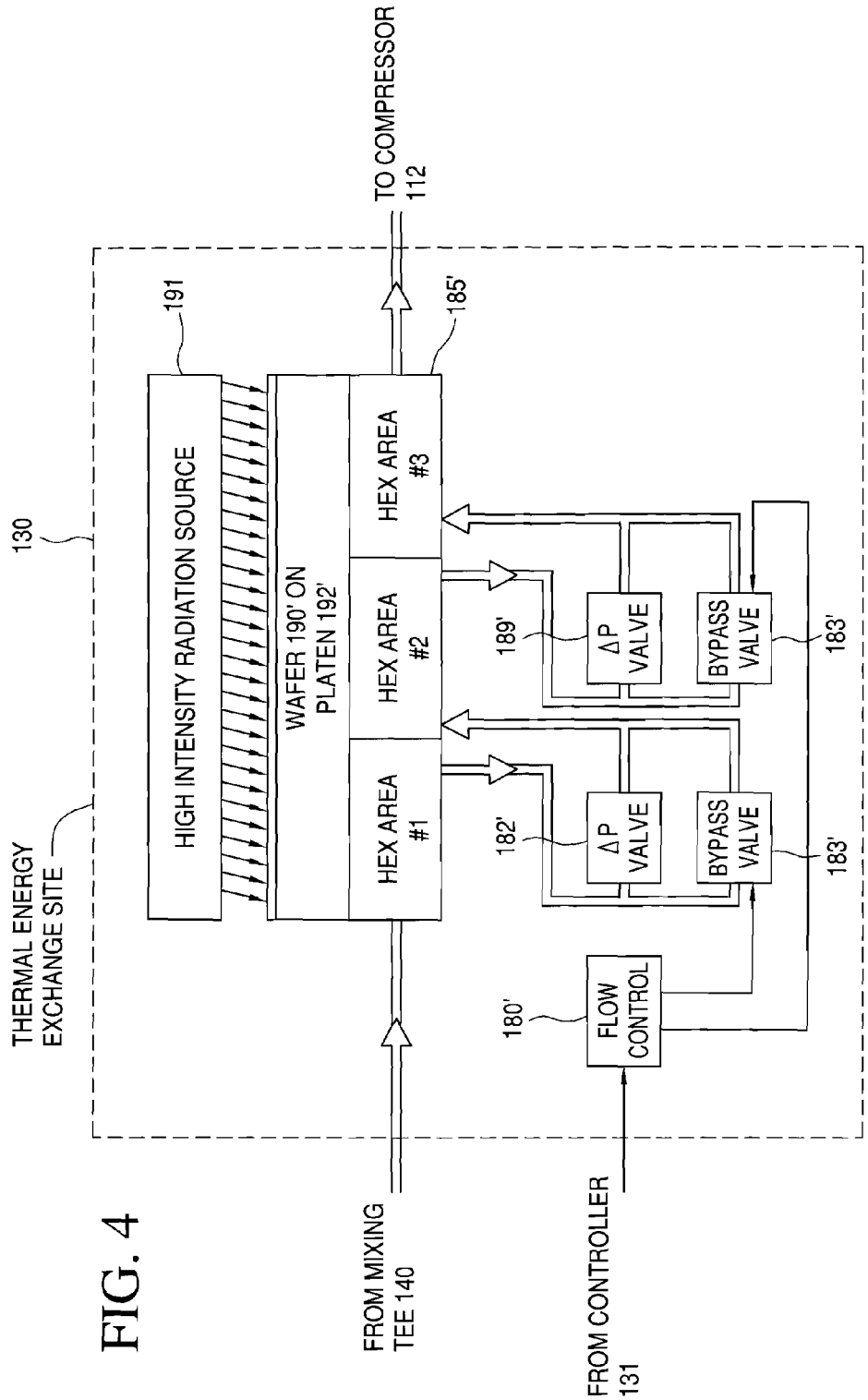
FIG. 4 is a block diagram depiction of an alternative multi-zone cooling system providing capability for thermal control of more than two zones using the Transfer Direct of Saturated Fluids approach.

In a further-reaching application of this technology, shown in FIG. 4, the output from a thermal control unit, such as the system 110 shown in FIG. 1, can be fed to a heat exchange site 130' in which the cooling needs require more than two levels of temperature, i.e. three or more levels. FIG. 4 illustrates how this can be accomplished. As seen in FIG. 4, a wafer 190 is heated by a high intensity radiation source 191 as it rests on the platen 192 on the cooling system 185', etc. Heat exchange areas 1, 2 and 3 are located in different parts of the heat exchanger 185', etc. which receives coolant from the mixing tee 140 (not specifically shown in FIG. 4). The controller 131 of FIG. 1 operates the flow control 180' which is commanded to control separate bypass valves 183', each of which shunts a different $\Delta p$ valve 182' or 189'.

The flow paths illustrate how differential cooling of the different areas (1, 2 and 3) of the heat exchanger portions 185' can be effected, using a single source of coolant from them mixing specifically, a two-phase coolant which varies in temperature dependent upon the pressure. Accordingly, coolant passing through heat exchange area 1 is directed either through a $\Delta p$ valve 182' or in parallel through a bypass valve 183' before return to the heat exchanger for subsequent cooling of the next area. In other words, the coolant passed through area #1 at an initial temperature set, at the mixing tee 140 (of FIG. 1), is then fed at the same temperature to area #2 (if the associated bypass valve 183' is open by the flow control 180'). If the bypass valve 183' is not opened, the output flow from area #1 is through the $\Delta p$ valve 182'. In this case, coolant at an incrementally lower temperature is supplied to area 2 in the next section of the heat exchanger 185'.

The areas are shown in FIG. 4 as being sequentially disposed, but this is merely for clarity and idealized purposes. The areas of the wafer that are to be differentially cooled can be in an entirely different geometry, so that the only requirement is that the successive heat exchange areas related to areas on the wafer 190' that are geometrically disposed in some known configuration. As in the transfer of coolant from area #1 to area #2, the output of area #2 is fed to the paired valve elements for area #3, namely the Δp valve 189' and a parallel bypass valve 183'. These are again controlled (opened and closed) by the flow control 180', and the output from area #2, either lowered in temperature or not, is then fed to area #3 of the heat exchanger complex 184, 185, etc. and the output from that area is returned to the compressor 112.

The serial arrangement with successively equivalent temperature outputs or incrementally lowered temperatures can thus be extended for a greater number of areas, dependent only on the heat exchange requirements in the thermal load. It will be appreciated that the number of pairs of Δp valves and bypass valves will be required to be correspondingly increased if the number of stages are increased.

Although applicants have shown and described different configurations of systems for providing a range of cooling functions from a given source of two-phase refrigerant, the invention is not limited thereto, but encompasses all forms and variations within the scope of the appended claims.

The invention claimed is:

1. A method of differentially controlling the temperatures of related but separate thermal loads from a single source of refrigerant in a mix of saturated liquid and vapor comprising the steps of:
   generating a first flow comprising a mixture of saturated vapor and liquid refrigerant at a chosen temperature and pressure;
   passing the generated flowing mixture of the first flow into at least two separate paths, each flowing to a different thermal load;
   adjusting the thermodynamic properties of the flows in the separate paths from the initially chosen temperature and pressure while maintaining the saturated vapor and liquid states in each of the paths; and,
   passing the thermodynamically adjusted flows in the separate paths in thermal exchange relation to the different but related chosen ones of the thermal loads.

2. The method as set forth in claim 1 above, wherein the step of adjusting thermodynamic properties comprises differentially lowering the temperature and pressure of flow in at least one of the separate paths relative to the chosen temperature and pressure in another of the paths.

3. The method as set forth in claim 2 above, wherein the step of adjusting thermodynamic properties is effected by selectively lowering the pressure and thereby the temperature of an individual part of the flow, and the step of passing the thermodynamically adjusted flow is effected serially in the different thermal loads.

4. The method as set forth in claim 3 above, further including the step of selectively bypassing the lowering of pressure and of temperature of flow to at least one specific chosen thermal load, so that such load is not differentially cooled relative to a related thermal load receiving the flowing mixture.

5. The method as set forth in claim 4 above, where there are more than two related thermal loads each with thermal exchange demands within the capability of the initial chosen temperature and mixture, and wherein the steps of passing the flows in thermal exchange relation to the different thermal loads comprise selectively bypassing the pressure drop between two successive thermal loads of the more than two thermal loads while serially supplying flow to the different thermal loads.

6. A thermal energy exchange system employing a single source of controlled temperature refrigerant for individually controlling the temperatures of different but related thermal loads, and comprising:
   a thermal exchange system generating a controllably variable refrigerant output mix of liquid and saturated vapor that is controllable in pressure and temperature;
   a coolant distribution system adjacent and serially interactive with each of the different thermal loads being processed; and
   a refrigerant flow system coupling the output of the thermal exchange system to the coolant distribution system and including a coolant flow adjustment system for selectively lowering the pressure of individual flows to the different thermal loads to lower the temperatures of such flows within the capability of the refrigerant output mix to maintain a mix of liquid and saturated vapor at controlled temperatures for thermal exchange with each of the different thermal loads.

7. The system as set forth in claim 6 above, wherein the coolant flow adjustment system comprises at least two flow branches to the coolant distribution system, and the flow branches further comprise a pressure dropping valve in at least one of the branches to lower the temperature of the flow therein.

8. The system as set forth in claim 7 above, wherein the system also comprises a controller for sending command signals for control of individual flows in the branches of the flow adjustment system, and the coolant distribution system is coupled to flow coolant serially through the different thermal loads.

9. The system as set forth in claim 7 above, wherein the coolant distribution system further comprises a number of flow branches, and including a pressure dropping valve for introducing predetermined increments of temperature variation in the received flow, and also an individual bypass valve shunting the associated pressure dropping valve, both the pressure dropping valve and associated bypass valve in a set being controlled by the controller, such that cooling at different temperature levels can be effected from the single initial source.

10. The system as set forth in claim 9 above, wherein the system has more than two thermal loads to be cooled at different but related temperatures, and wherein the thermal exchange system has separate exchange areas for each thermal load, each including a separate differential pressure valve and a separate shunting valve pair, and the coolant flow is coupled serially through the different thermal loads via the paired valve sets.

11. A system for thermal control from a common source of refrigerant of more than one thermal load, the thermal loads being in proximity to each other and having different but related heat load requirements, the system using a combination providing direct transfer of thermal energy between the liquid and vapor phases of a two-phase refrigerant and different thermal loads, the system comprising:
   a heat exchange system having at least two different thermal load areas having different load temperature requirements;
   a temperature control system for the heat exchange system and employing direct control of the vapor and liquid phases of a saturated fluid refrigerant compressed from a gaseous state and divided into a pressurized flow of variable mass and a cooled expanded differential flow;
   a controller responsive to the cooling needs of the thermal loads for operating the temperature control system to provide a vapor/liquid mix of the mass flow and differential flow at an initial target temperature; and a thermal load temperature control combination receiving the initial target temperature flow output and including at least two thermal exchange flow controls thermally coupled in series to different portions of the thermal loads, said flow controls being responsive to control signals from the controller for providing refrigerant flow at the temperature level received to a first thermal load and at an incrementally lowered temperature level to a second thermal load resulting from a pressure drop.

12. The system as set forth in claim 11 above, wherein the system includes, for each coupling to a different portion of the thermal load, a differential pressure valve for dropping the pressure and therefore the temperature of refrigerant flowing therethrough, and a bypass valve coupled in parallel to the differential pressure valve and responsive to control signals from the controller for shunting flow from the coupled area of the thermal load to the next area of the thermal load.

13. The system as set forth in claim 11 above, wherein the heat exchange system comprises at least three areas of heat exchanger, and wherein the system further includes individual sets of differential pressure valves and parallel-coupled bypass valves each controlled by the controller, so as to provide a desired sequence of pressure and temperature drops in the refrigerant for the different areas of the heat exchanger.

* * * * *